(12) United States Patent
Xu et al.

(10) Patent No.: US 7,672,135 B2
(45) Date of Patent: Mar. 2, 2010

(54) HEAT SINK

(75) Inventors: Li-Fu Xu, Shenzhen (CN); Zhi-Guo Zhang, Shenzhen (CN); Ning-Yu Wang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/124,791

(22) Filed: May 21, 2008

(65) Prior Publication Data

US 2009/0262502 A1 Oct. 22, 2009

(30) Foreign Application Priority Data

Apr. 22, 2008 (CN) .................... 2008 2 0300611 U

(51) Int. Cl.
*H05K 7/20* (2006.01)
*F28F 7/00* (2006.01)

(52) U.S. Cl. ........................ 361/710; 361/704; 361/709; 165/80.3; 165/185; 174/16.3

(58) Field of Classification Search ................. 361/697, 361/704, 709–710, 719; 165/80.3, 185; 174/16.3; D13/179
See application file for complete search history.

(56) References Cited

U.S. PATENT DOCUMENTS

| 7,077,188 | B2 * | 7/2006 | Chen | 165/80.3 |
| 7,102,890 | B2 * | 9/2006 | Lee et al. | 361/704 |
| 7,120,026 | B2 * | 10/2006 | Chen | 361/704 |
| 7,284,597 | B2 * | 10/2007 | Tang | 165/80.3 |
| 7,417,860 | B2 * | 8/2008 | Yang et al. | 361/710 |
| 7,447,020 | B2 * | 11/2008 | Xia et al. | 361/695 |
| 7,500,513 | B2 * | 3/2009 | Zhang et al. | 165/76 |
| 2006/0113062 | A1 * | 6/2006 | Yang | 165/80.3 |
| 2007/0035926 | A1 * | 2/2007 | Xia et al. | 361/695 |
| 2009/0008071 | A1 * | 1/2009 | Miao et al. | 165/167 |

FOREIGN PATENT DOCUMENTS

WO WO 2007101376 A1 * 9/2007

* cited by examiner

*Primary Examiner*—Jayprakash N Gandhi
*Assistant Examiner*—Robert J Hoffberg
(74) *Attorney, Agent, or Firm*—D. Austin Bonderer

(57) ABSTRACT

A heat sink includes a plurality of fins parallel to each other. The fins include a top portion having a flange. The opposite ends of each flange are rounded. Two rounded corners are located below the plane defined by the flange.

9 Claims, 5 Drawing Sheets

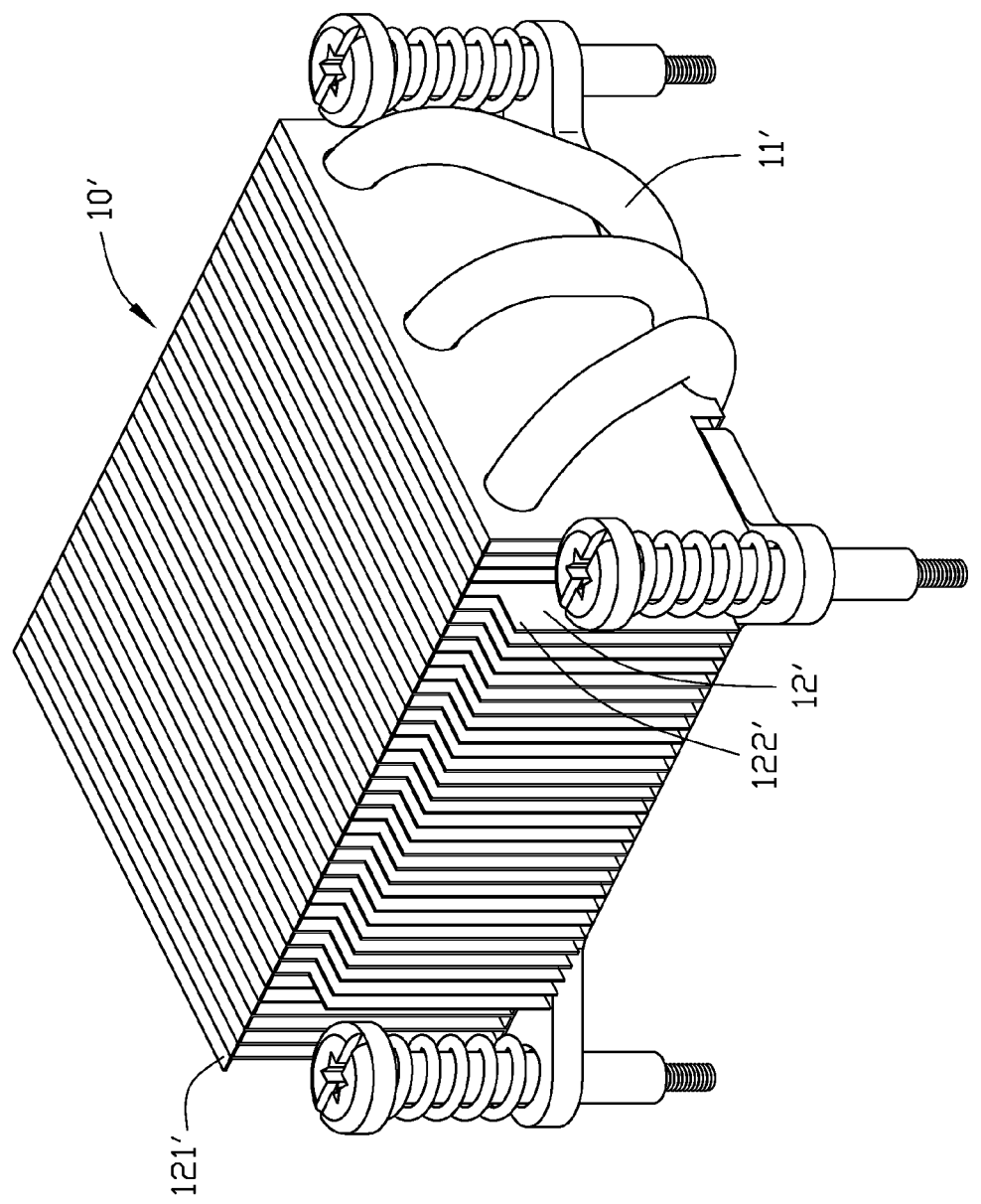
FIG. 5 <PRIOR ART>

HEAT SINK

BACKGROUND

1. Technical Field

The present invention relates to heat sinks, particularly to a heat sink for dissipating heat from an electronic device.

2. Description of Related Art

Computers are continuing to rapidly develop. Electronic devices in computers, such as central processing units (CPUs), generate a lot of heat during normal operation, which can deteriorate their operational stability, and damages associated electronic devices. Thus, the heat must be removed quickly to ensure normal operation of the CPU. A heat sink is often provided on the CPU to remove heat therefrom.

Referring to FIG. 5, a heat sink 10' according to the prior art includes several U-shaped heat pipes 11' and a plurality of parallel fins 12'. The fins 12' are bent towards a same direction and are soldered together. The thickness of each fin 12' is about 0.3~0.4 mm. Furthermore, corners of each fin 12' are formed in right angle, which is dangerous to lacerate users' fingers. For example, right angles 121', 122' of the fins 12' pose the danger to people who are using the heat sink 10'.

SUMMARY

A heat sink includes a plurality of fins parallel to each other. The fins include a top portion having a flange. The opposite ends of each flange are rounded. Two rounded corners are located below the plane defined by the flange.

Other advantages and novel features will be drawn from the following detailed description of preferred embodiments with attached drawings, in which:

BRIEF DESCRIPTION OF THE DRAWINGS

FIG. 5 is an isometric view of a heat sink of a prior art.

DETAILED DESCRIPTION

Figure 1:
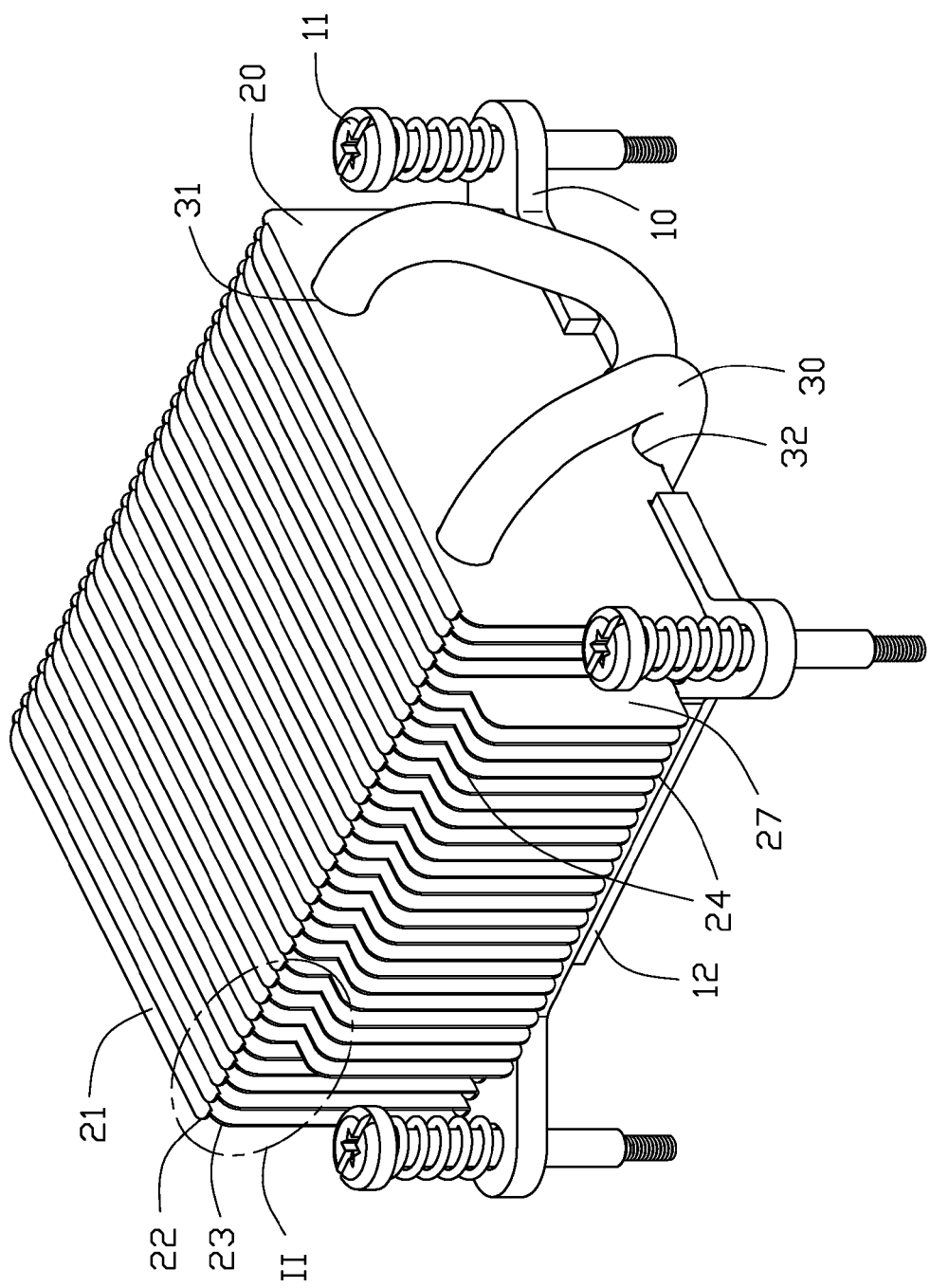
FIG. 1 is an isometric view of a heat sink of in accordance with an exemplary embodiment of the present invention.

Referring to FIG. 1, a heat sink in accordance with a preferred embodiment of the present invention includes a base 10, a plurality of parallel fins 20 on the base 10, and a pair of heat pipes 30 extending through the fins 20 to transfer heat from the base 10 to the fins 20.

Figure 2:
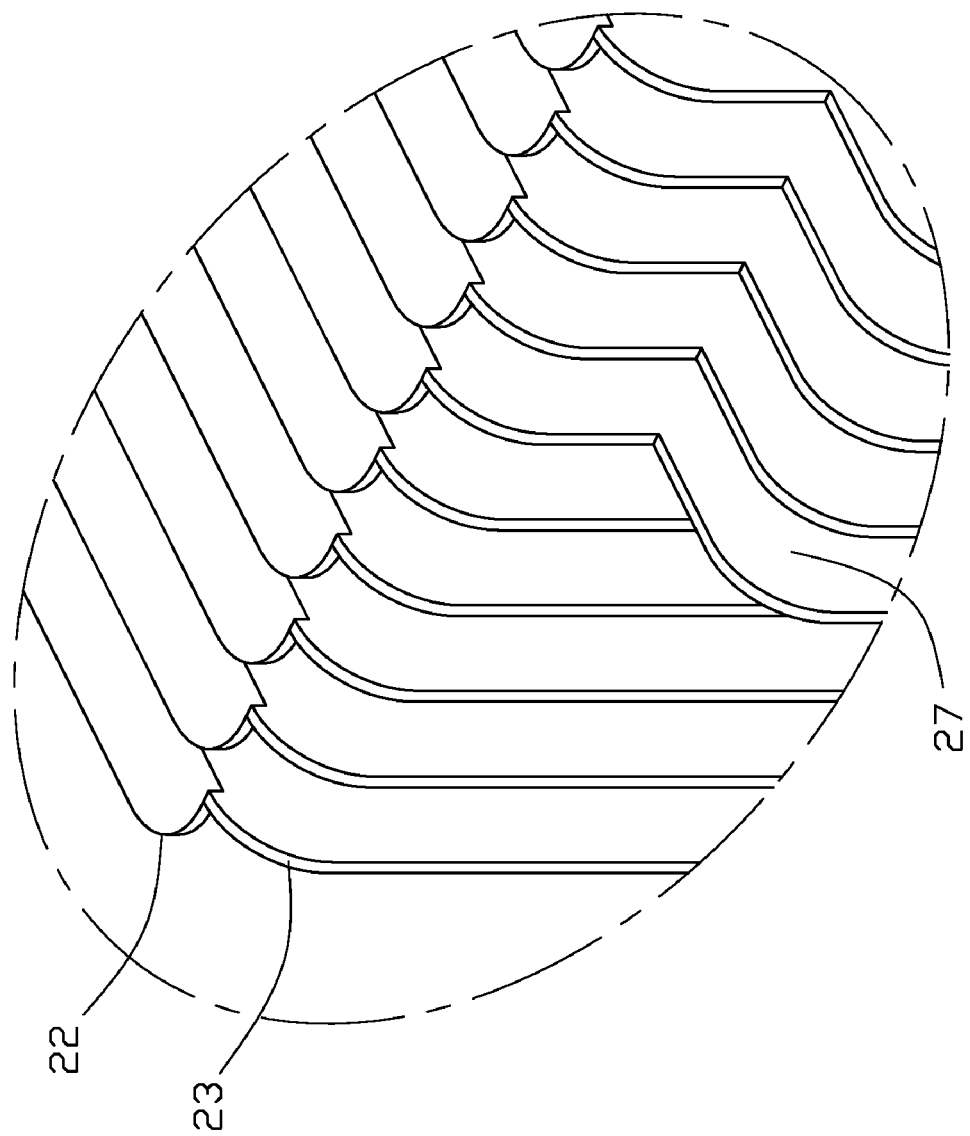
FIG. 2 is an enlarged view of an encircled portion 11 of FIG. 1.
Figure 3:
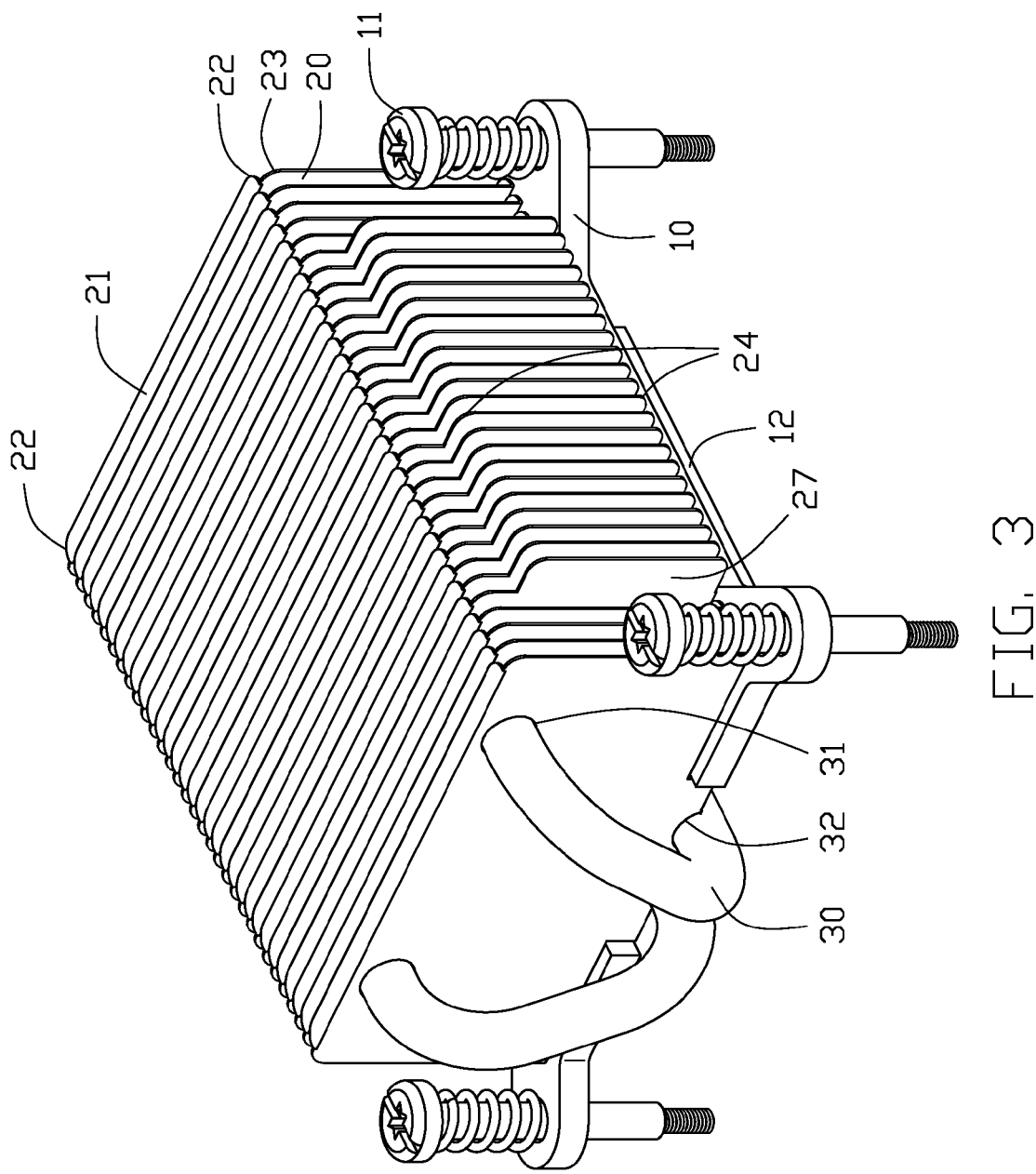
FIG. 3 is another isometric view of FIG. 1.

Referring to FIG. 2 and FIG. 3, four screws 11 are mounted on four corners of the base 10 respectively. A heat dissipating portion 12 is formed on the bottom of the base 10. An area of the heat dissipating portion 12 is approximately equal to an area of a CPU. Two semicircular channels (not shown) are defined in the heat dissipating portion 12 corresponding to two heat pipes 30.

Each fin 20 is a thin metallic plate extending perpendicularly up from the base 10. Two circular channels 31 and two semicircular channels 32 are defined in each fin 20 corresponding to two heat pipes 30. The top of each fin 20 is bent towards a same direction to form a flange 21. Opposite ends of each flange 21 are cut to form first rounded corners 22. The top corners of each fin 20 are cut to form second rounded corners 23 adjacent to the flanges 21. The length of the flange 21 is shorter than the length of the fin 20. Wings 27 are projected from a middle portion at each end of the fins 20. Top and bottom corners of each wing 27 are cut to form third rounded corners 24. When the heat sink is used, the first, second, third rounded corners 22, 23, 24 are safer to handle than the right-angle corners of the prior art, thus protecting users' fingers from being cut.

Each heat pipe 30 is approximately U-shaped. The heat pipe 30 is sealed container, wick structure attached at inner surface and working fluid and its vapor inside. The heat pipe 30 extends through the semicircular channel of the heat dissipating portion 12, the semicircular channel of the fin 20 and the circular channel 31 of the fin 20. The heat pipe 30 transfers heat from the base 10 to the fins 20 for dissipating heat fast.

Figure 4:
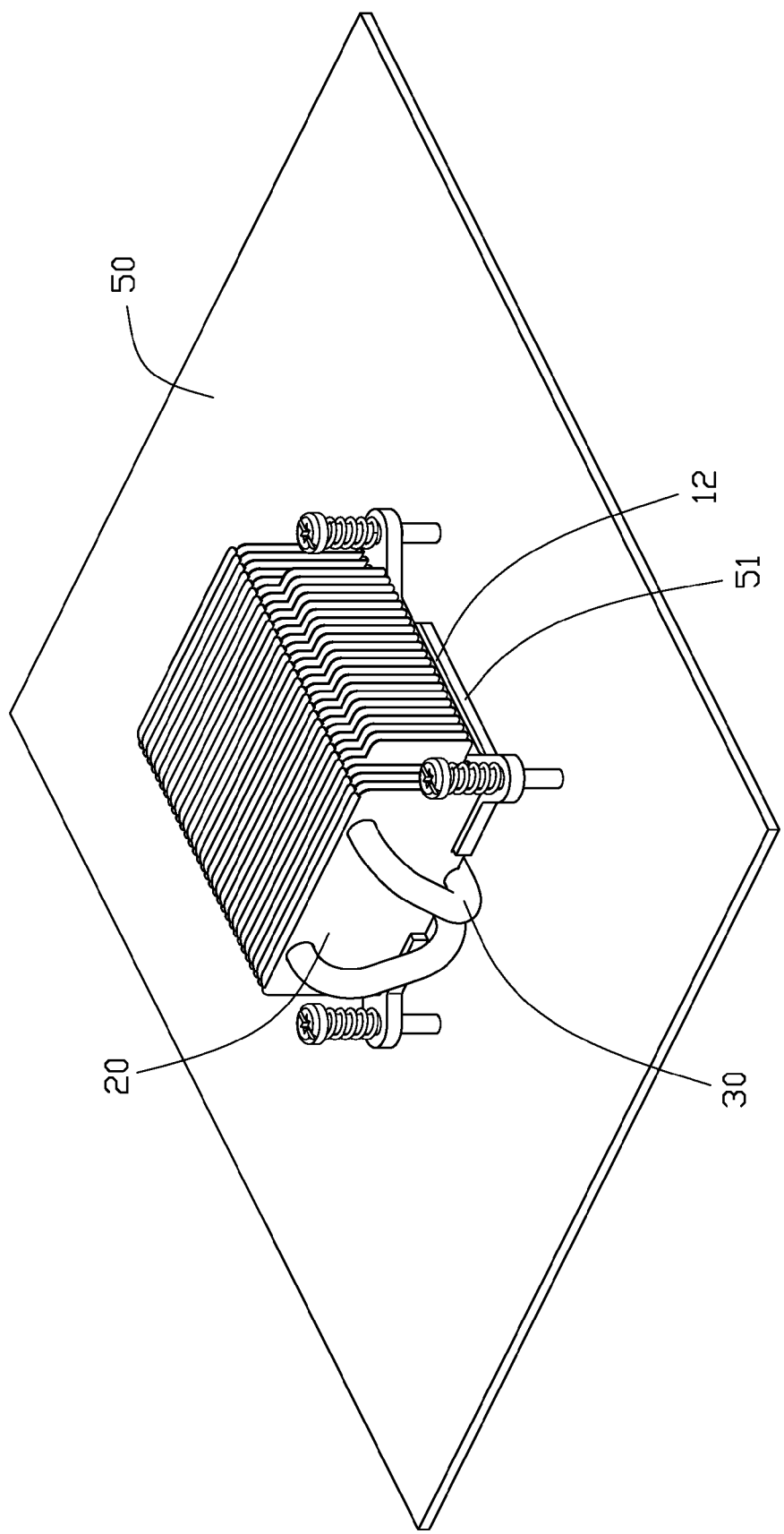
FIG. 4 is a view of the heat sink assembled on a motherboard.

Referring to FIG. 4, when used, the heat sink is mounted on a CPU 51 of a motherboard 50. The heat dissipating portion 12 of the heat sink contacts with the CPU 51. The heat dissipating portion 12 transfers heat produced by the CPU 51 to the fins 20 via the heat pipes 30. Thereby, the temperature of the CPU 51 is reduced.

It is to be understood, however, that even though numerous characteristics and advantages have been set forth in the foregoing description of preferred embodiments, together with details of the structures and functions of the preferred embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat sink comprising:
   a plurality of fins parallel to each other, wherein the fins comprise:
      a top portion having a straight edge;
      two rounded corners located at opposite ends of the straight edge; and
   perpendicularly extends from the straight edge towards an adjacent fin; and wherein one or more of the fins further comprise wings that protrude from a middle portion of the fin, the wings have rounded corners and each of the wings are coplanar with the fin.

2. The heat sink as described in claim 1, further comprising a base and two heat pipes; wherein the fins are mounted on the base.

3. The heat sink as described in claim 2, wherein a heat dissipating portion is formed on the bottom of the base adapted to contact an electronic component.

4. The heat sink as described in claim 2, wherein the fins define two channels that are adapted to accommodate the heat pipes.

5. A heat dissipation system for cooling a heat generating element, the heat dissipation system comprising:
   at least two fins for dissipating heat, a top portion of each fin having a flange, first rounded corners formed at opposite ends of each flange; wherein a wing protrudes from a middle portion of one or more fins, second rounded corners formed at top and bottom corners of each wing;
   wherein third rounded corners of each fin are located below the plane defined by the flange adjacent to the first rounded corners the flange is perpendicular to the fin and extends towards an adjacent fin; and the wing is coplanar with the fin.

6. The heat dissipation system as described in claim 5, wherein the length of the flange is shorter than the length of the fin.

7. The heat dissipation system as described in claim 5, further comprising a base and two heat pipes; wherein the fins are mounted on the base.

8. The heat dissipation system as described in claim 7, wherein a heat dissipating portion is formed on the bottom of the base adapted to contact an electronic component.

9. The heat dissipation system as described in claim 7, wherein one or more fins define two channels that are adapted to accommodate the heat pipes.

* * * * *